United States Patent [19]
Morita et al.

[11] Patent Number: 5,990,618
[45] Date of Patent: Nov. 23, 1999

[54] PLASMA DISPLAY PANEL AND HEAT SINK

[75] Inventors: Makoto Morita, Neyagawa; Takashi Ichiyanagi, Hirakata; Junji Ikeda, Ikoma; Naomi Nishiki, Kyoto; Takao Inoue, Hirakata; Daido Komyoji, Ikoma; Tsutomu Kawashima, Katano, all of Japan

[73] Assignee: Matsushita Electric Industrial Co., Ltd., Osaka, Japan

[21] Appl. No.: 09/151,196

[22] Filed: Sep. 10, 1998

Related U.S. Application Data

[62] Division of application No. 08/778,426, Jan. 2, 1997, Pat. No. 5,831,374.

[30] Foreign Application Priority Data

Jan. 12, 1996 [JP] Japan ................................ 8-003550

[51] Int. Cl.⁶ .................................................. H01J 17/28
[52] U.S. Cl. ............................ 313/582; 313/46; 313/493; 313/573; 313/634
[58] Field of Search .................................. 313/40, 45, 46, 313/493, 573, 581, 582, 634

[56] References Cited

U.S. PATENT DOCUMENTS

| | | |
|---|---|---|
| 5,525,862 | 6/1996 | Miyazaki ................................ 313/582 |
| 5,670,843 | 9/1997 | Matsuura ............................ 313/634 X |
| 5,747,932 | 5/1998 | Hayashi et al. ......................... 313/582 |

*Primary Examiner*—Vip Patel
*Assistant Examiner*—Matthew J. Gerike
*Attorney, Agent, or Firm*—Panitch Schwarze Jacobs & Nadel, P.C.

[57] ABSTRACT

To increase heat dissipation from a plasma display panel, a heat sinking unit 2 bonded to a curved back surface 11 of a panel unit includes a large number of fin blocks 21 arranged spaced apart from each other by a prescribed distance and a flexible thin-wall portion 22, and a joining section 221, which consists of fin anchoring portions 212 and thin-wall portions 22, is capable of being bent between the fin blocks 21, thus allowing the heat sinking unit 2 to conform to the curvature of the panel unit back surface 11.

5 Claims, 12 Drawing Sheets

PLASMA DISPLAY PANEL AND HEAT SINK

CROSS REFERENCE TO RELATED APPLICATION

This application is a division of application Ser. No. 08/778,426 now U.S. Pat. No. 5,831,374 filed Jan. 2, 1997, entitled PLASMA DISPLAY PANEL, METHOD OF FABRICATING THE SAME, AND DISPLAY APPARATUS USING THE PLASMA DISPLAY PANEL.

BACKGROUND OF THE INVENTION

The present invention relates to a plasma display panel for displaying an image by light emission of a plurality of discharge cells, a method of fabricating the same, and a display apparatus using the plasma display panel.

A display apparatus using a plasma display panel which contains a plurality of discharge cells is constructed to display an image by applying a voltage across electrodes of each discharge cell and thereby causing the desired discharge cell to emit light. A panel unit, which is the main part of the plasma display panel, is fabricated by bonding two glass base plates together in such a manner as to sandwich a plurality of discharge cells between them.

In the thus constructed plasma display panel of the prior art, the discharge cells caused to emit light for image formation generate heat, which causes the temperature of the plasma display panel to rise. The heat generated in the discharge cells is transferred to the glass forming the base plates, but because of the properties of the base plate material, the heat conduction in directions parallel to the panel face is difficult. Furthermore, the temperature of a discharge cell activated for light emission rises markedly, while the temperature of a nonactivated discharge cell does not rise much. This has presented the problem that, in the prior art plasma display panel, the panel face temperature of the plasma display panel rises locally, accelerating thermal deterioration of affected discharge cells, unless some heat sinking measures are taken.

Further, since the temperature difference between activated and nonactivated discharge cells is very large, a stress is applied to the panel unit, the resulting problem being that the panel unit of the prior art plasma display panel is prone to breakage.

When the voltage to be applied to the electrodes of discharge cells is increased, the brightness of the discharge cells increases but the amount of heat generation in such cells also increases. Discharge cells whereto large voltages are applied for activation therefore become more susceptible to thermal deterioration; and the cells tend to exacerbate the breakage problem of the panel unit of the plasma display panel.

FIG. 12 is a schematic cross-sectional view showing a heat sinking structure of a plasma display panel according to the prior art. As shown in FIG. 12, a supporting plate 300 is provided on, covering the entire back surface of a panel unit 550 of the prior art plasma display panel (hereinafter abbreviated as PDP) 500. The PDP 500 is supported by the supporting plate 300. The PDP 500 is fixed in place by means of double-sided adhesive tapes 310 attached along both edges of the supporting plate 300. In the prior art PDP 500, a heat conductive silicone sheet is interposed between the panel unit 550 and the supporting plate 300 to transfer the heat generated in the PDP 500 to the supporting plate 300. However, in the prior art PDP 500 using the silicone sheet, since the panel unit 550 is curved, it has been difficult to bring the entire panel unit 550 into intimate contact with the supporting plate 300.

In the prior art PDP 500 shown in FIG. 12, a heat conductive liquid (comprising silicone grease and alumina, and the like) 330 is filled between the panel unit 550 and the supporting plate 300 to completely fill the gap between them. In this way, in the prior art PDP 500, the gap between the panel unit 550 and the supporting plate 300 is filled with the heat conductive liquid 330 via which the opposing faces of the panel unit 550 and supporting plate 300 are contacted with each other in a heat conductible manner over the entire regions thereof.

Further, in the prior art PDP 500, fins 320 are formed over almost entire surface on the rear side of the supporting plate 300. With this structure, it is claimed that the heat generated in the panel unit 550 of the prior art PDP 500 is transferred to the supporting plate 300 via the heat conductive liquid 330 and dissipated through the fins 320.

However, even if the space formed between the panel unit 550 and the supporting plate 300 is filled with the heat conductive liquid 330, the problem of global or local temperature rise in the panel unit 550 cannot be solved for reasons explained below.

That is, the heat conductivity of the conventional heat conductive liquid 330 is poor compared with other heat sinking material such as aluminum, and moreover, the layer of the heat conductive liquid 330 has a thickness amounting to a few millimeters; as a result, the heat generated in discharge cells 400 is not sufficiently transferred to the fins 320, but is accumulated in the panel unit 550 of the PDP 500. Furthermore, when the panel unit size is increased, the layer thickness of the heat conductive liquid 330 becomes thicker, resulting in a structure tending to further increase the temperature of the panel unit 550.

In the conventional prior art PDP 500, effort has been made to reduce the space formed between the panel unit 550 and the supporting plate 300 in order to enhance the efficiency of heat transfer from the panel unit 550 to the fins 320. However, the curvature and the degree of curvature of the panel unit 550 differ for each individual panel unit, and also, the supporting plate 300 does not have a perfectly flat surface. As a result, it has been impossible to bring the opposing faces of the panel unit 550 and support plate 300 into perfect contact with each other.

In order to solve this problem, the prior art display apparatus is provided with cooling fans which impel air to promote heat dissipation through the fins. However, when such fans are mounted in the display apparatus, since the lifetime of fan bearings is shorter than that of the panel unit, it becomes necessary to replace the fan bearings during the life of the display apparatus. Furthermore, the provision of fans causes a noise problem.

In the prior art display apparatus, therefore, it has been demanded that the number of fans installed in the display apparatus be reduced, and also that an apparatus not requiring a fan (a fanless apparatus) be developed.

BRIEF SUMMARY OF THE INVENTION

It is accordingly an object of the present invention to improve heat dissipation of a plasma display panel and solve the above-enumerated problems associated with temperature rises, and to reduce the number of cooling fans required or eliminate the need for cooling fans in a display apparatus using the plasma display panel.

To achieve the above object, according to the present invention, there is provided a plasma display panel comprising: a panel unit of a curved panel-like shape containing a large number of discharge cells arranged horizontally and vertically in a matrix array; and a heat sinking unit bonded along a curved back surface of the panel unit, wherein the heat sinking unit includes a large number of heat dissipating portions arranged spaced apart from each other by a prescribed distance, and a flexible joining section for connecting the panel unit with the heat dissipating portions in a heat conductible manner.

According to the present invention, there is also provided a plasma display panel comprising: a panel unit of a curved panel-like shape containing a large number of discharge cells arranged horizontally and vertically in a matrix array; a heat sinking unit located on a back surface of the panel unit and connected thereto in such a manner as to be capable of conducting heat from the panel unit; and a high-orientation graphite layer interposed between the panel unit and the heat sinking unit.

According to the present invention, there is also provided a method of fabricating a plasma display panel, comprising the steps of: supporting a panel unit by a large number of flexible pins from the front surface side thereof, the panel unit having a curved panel-like shape and containing a large number of discharge cells arranged horizontally and vertically in a matrix array; overlaying a heat sinking unit on the panel unit in such a manner as to face a back surface of the panel unit, the heat sinking unit comprising a large number of heat dissipating portions arranged spaced apart from each other by a prescribed distance and a flexible joining section for connecting the panel unit with the heat dissipating portions in a heat conductible manner; and bonding the heat sinking unit in such a manner as to conform to the curved shape of the back surface of the panel unit by pressing the heat sinking unit against the back surface of the panel unit.

According to the present invention, there is also provided a display apparatus comprising: a plasma display panel having a panel unit of a curved panel-like shape containing a large number of discharge cells arranged horizontally and vertically in a matrix array, and a heat sinking unit bonded along a curved back surface of the panel unit; an electrical circuit for driving the plasma display panel; and a cabinet for accommodating therein the plasma display panel and the electrical circuit.

According to the present invention, there is further provided a display apparatus comprising: a plasma display panel having a panel unit of a curved panel-like shape containing a large number of discharge cells arranged horizontally and vertically in a matrix array, a heat sinking unit located on a back surface of the panel unit and connected thereto in such a manner as to be capable of conducting heat from the panel unit, and a high-orientation graphite layer interposed between the panel unit and the heat sinking unit; an electrical circuit for driving the plasma display panel; and a cabinet for accommodating therein the plasma display panel and the electrical circuit.

The plasma display panel and the display apparatus according to the present invention are capable of suppressing a temperature rise in the panel unit, and not only heat dissipation but also durability is greatly improved compared with the prior art structure. The invention thus makes a substantial contribution to improving the brightness of the display apparatus, extending the lifetime, and reducing the number of cooling fans or eliminating the need for such fans.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DETAILED DESCRIPTION OF THE INVENTION

A plasma display panel, a method of fabricating the same, and a display apparatus using the plasma display panel will be described below in accordance with the present invention with reference to the accompanying drawings illustrating the preferred embodiments thereof.

Embodiment 1

Figure 1:
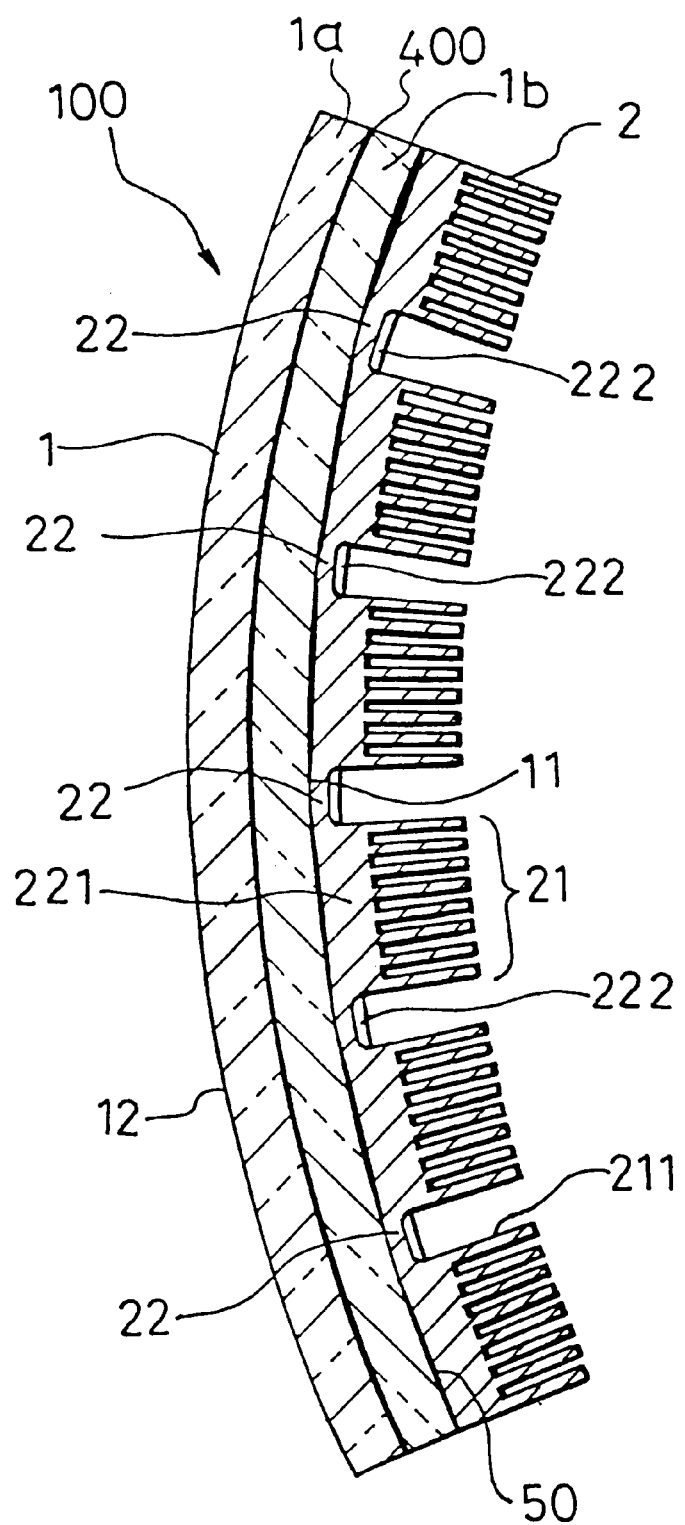
FIG. 1 is a schematic cross-sectional view showing a plasma display panel according to a first embodiment of the present invention.

FIG. 1 is a schematic cross-sectional view showing a plasma display panel according to a first embodiment of the present invention. In FIG. 1, the plasma display panel (hereinafter abbreviated as PDP) 100 is a DC color plasma display panel for use in a 26-inch diagonal display apparatus.

The PDP 100 comprises a panel unit 1, which is the main part, and a heat sinking unit 2. The panel unit 1 contains a large number of discharge cells 400 arranged horizontally and vertically in a matrix array manner between two glass substrates 1a and 1b. The panel unit 1 is about 5.5 mm in thickness. Though not shown in the figure, the panel unit 1 is provided with a plurality of flexible circuit boards which connect electrodes of the discharge cells 400 to an electrical circuit for electrically driving the panel unit 1. Each flexible circuit board has a tape-like structure capable of being bent. The plurality of circuit boards are arranged spaced apart from each other by a prescribed distance and drawn out from edge faces of the panel unit 1. The electrical driving circuit is arranged along side faces of the PDP 100 with the flexible circuit boards bent over, or is overlaid on a back surface 11 of the panel unit 1.

The panel unit 1 is distorted, with its back surface curved to form a concave, by the heat applied when joining the top and bottom glass substrates 1a and 1b together. In this embodiment, there is a displacement of about 2 mm between the periphery and the largest curved portion of the panel unit 1. In FIG. 1 as well as the figures hereinafter given, the curved condition of the panel unit 1 is exaggerated for clarity.

The heat sinking unit 2 made of aluminum or its alloy is joined to the panel unit back surface 11 via an adhesive layer 50 applied to a thickness of about 0.1 mm. That is, the entire joining surface of the heat sinking unit 2 is bonded to the panel unit back surface 11 with the adhesive forming the adhesive layer 50. A one-component thermosetting silicone adhesive having excellent rubber elasticity (for example, FE-61 manufactured by Shin-Etsu Chemical Co., Ltd.) is used as the adhesive.

Figure 2:
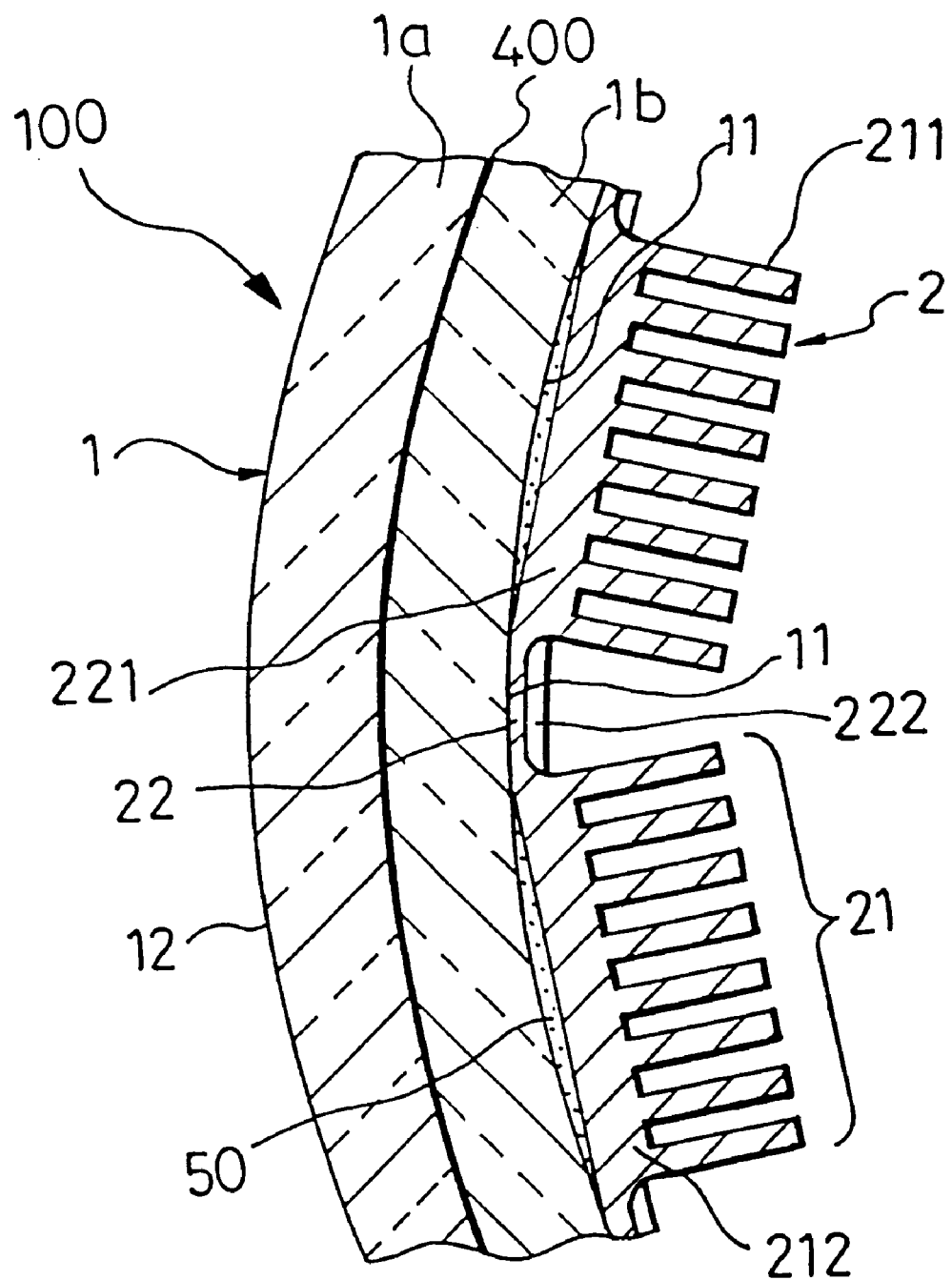
FIG. 2 is a cross-sectional view showing an essential portion of the plasma display panel of FIG. 1 in enlarged form.
Figure 3:
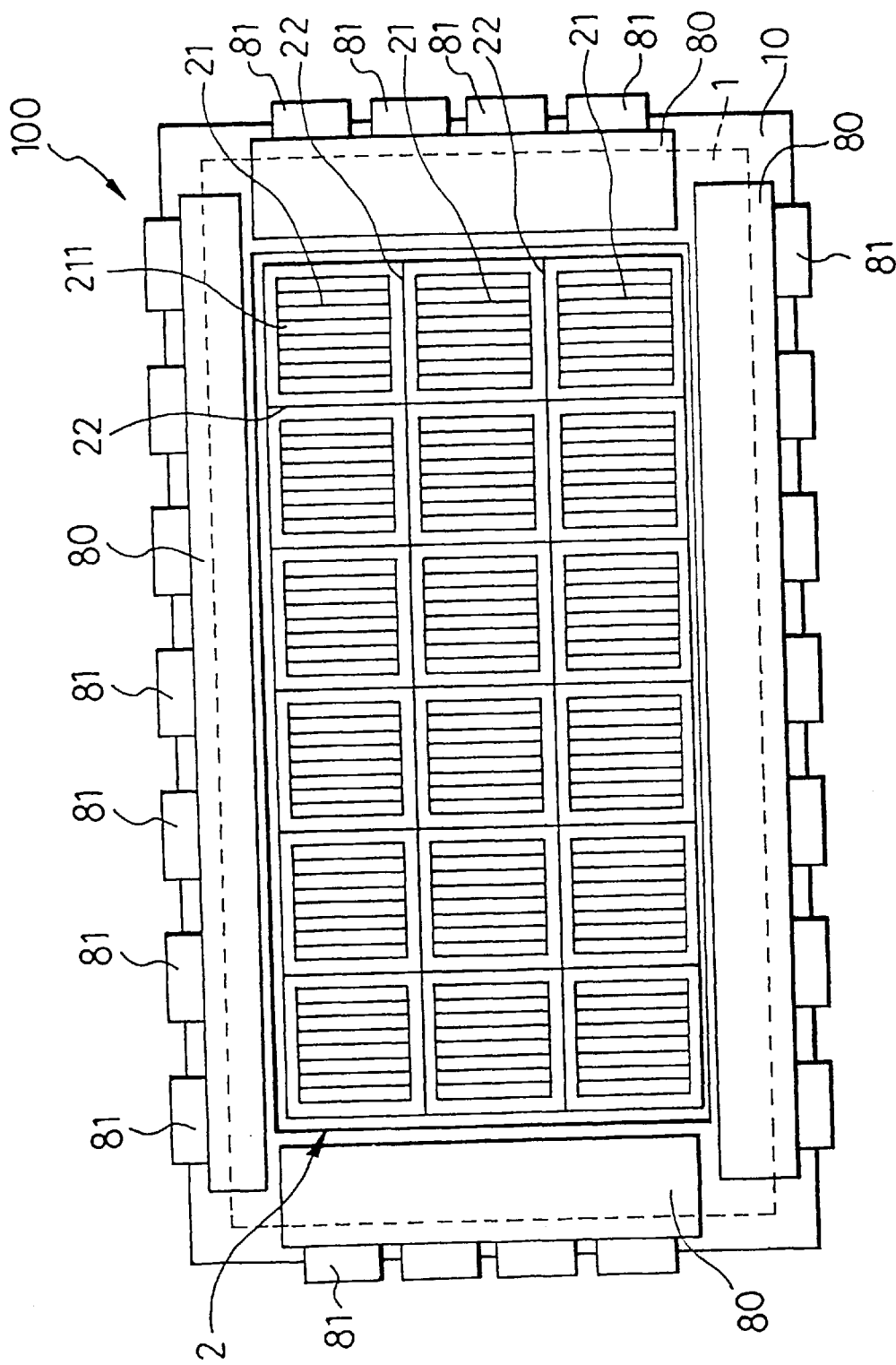
FIG. 3 is a rear view of the plasma display panel of FIG. 1.

FIG. 2 is an enlarged cross-sectional view showing the heat sinking unit 2 of the first embodiment. As shown in FIG. 2, the heat sinking unit 2 comprises fin blocks 21 and thin-wall portions 22 between the fin blocks 21. Each of the fin blocks 21 includes a large number of integrally formed fins 211 extruding outwardly or backwardly. The fin blocks 21 are each shaped in the form of a square having sides of about 100 mm, and are arranged in a checkerboard or matrix pattern over the entire back surface 11 of the panel unit 1 as shown in FIG. 3. The fin blocks 21 are connected with one another by the thin-wall portions 22 about 2 mm wide. The fins 211 of each fin block 21 are formed extending in a vertical direction of the panel unit 1. The plurality of fins 211 formed on each fin block 21 are spaced apart from each other by about 2 mm, each fin having a thickness of about 2 mm and an extrusion length of about 25 mm.

Each thin-wall portion 22 connecting between each fin block 21 has a thickness of about 1 mm which is thinner than a fin anchoring portion 212 of each fin block 21. This structure gives flexibility to the thin-wall portion 22. Thus a joining portion 221 between the panel unit 1 and the heat sinking unit 2 consists of the fin anchoring portions 212 and the thin-wall portions 22.

As shown in FIG. 2, each thin-wall portion 22 of the heat sinking unit 2 is curved along the curvature of the panel unit back surface 11. As a result, the entire heat sinking unit 2 is mounted in such a manner as to follow the curvature of the panel unit back surface 11. A small gap is formed between each fin anchoring portion 212 of the joining portion 221 and the panel unit back surface 11, but this gap is filled with an adhesive layer 50.

FIG. 3 is a rear view showing the PDP 100 of the first embodiment. As shown in FIG. 3, the plurality of fin blocks 21 of the heat sinking unit 2 are arranged in a checkerboard or matrix pattern on the back surface 11 of the panel unit 1. The panel unit 1 is rigidly mounted on an aluminum frame 10 having an opening in the center. The heat sinking unit 2 is located in the opening of the frame 10. Furthermore, as shown in FIG. 3, electrical circuitry 80 connected to the flexible circuit boards 81 is mounted on the frame 10.

The heat generated inside the panel unit 1 during the operation of the PDP 100 is dissipated from the outer surfaces of the panel unit 1. In particular, much of the heat generated inside the panel unit 1 is conducted from the panel unit back surface 11 to the heat sinking unit 2 through the adhesive layer 50. The heat conducted to the heat sinking unit 2 is dissipated into the outside air from the surfaces of the heat sinking unit 2, especially the surfaces of the fins 211. Compared with the prior art PDP using a silicone sheet of 2 mm or greater thickness as an intervening layer, the thickness of the adhesive layer 50 is extremely thin. Therefore, the thermal resistance of the adhesive layer 50 is small, so that the heat from the panel unit 1 is quickly transferred to the heat sinking unit 2. The heat sinking unit 2 is formed from an aluminum material having a good heat sinking property, with the fins 211 increasing the substantial heat dissipating area. Thus the PDP 100 of the present embodiment has an excellent heat sinking structure.

Figure 4:
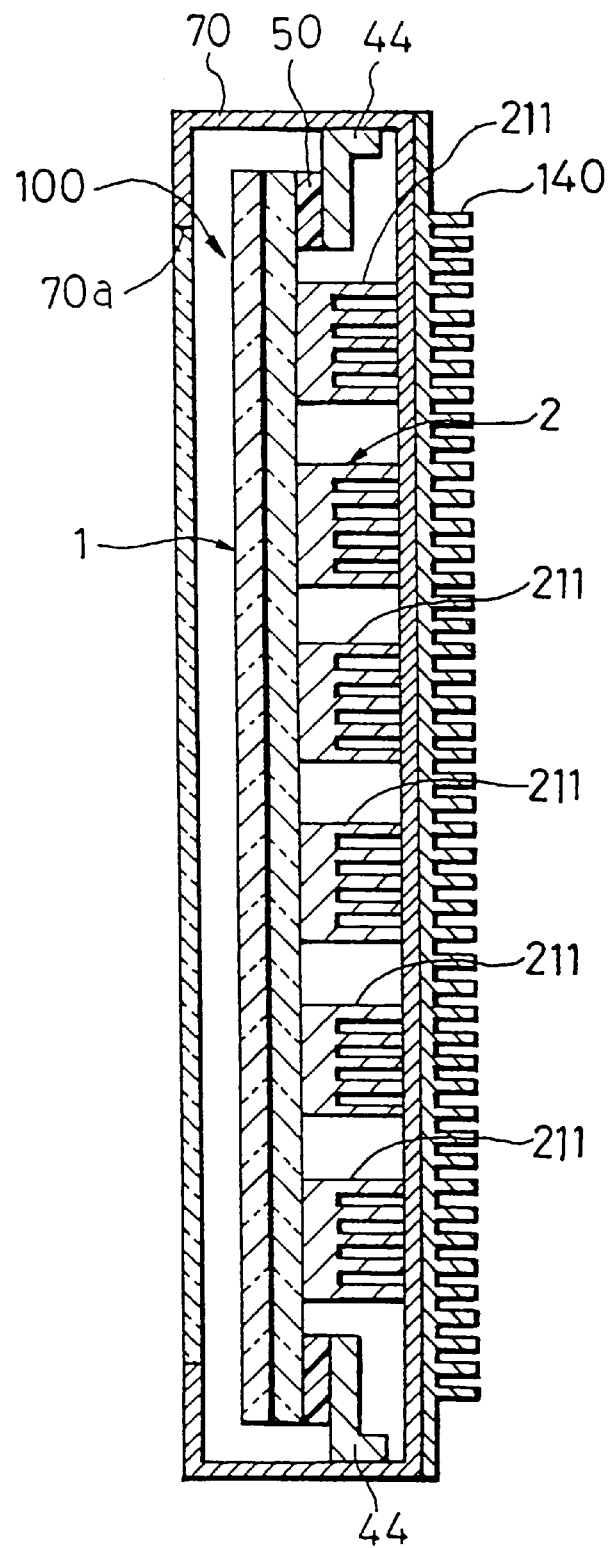
FIG. 4 is a cross-sectional view showing a display apparatus having the plasma display panel of FIG. 1.

FIG. 4 is a schematic cross-sectional view showing a display apparatus using the PDP 100 of the first embodiment.

In FIG. 4, a cabinet 70 of the display apparatus is an aluminum box. The PDP 100 is mounted with its front surface facing outward through an opening 70a in the front of the cabinet 70. The opening 70a is covered by a plate formed from a transparent material such as a transparent acrylic resin or transparent glass. The heat sinking unit 2 is mounted with the outside faces of its outer edge portions 44 contacting the inner faces of the side portions of the cabinet 70. The arrays of the fins 211 extend in the vertical direction of the PDP 100; this structure facilitates air flow by natural convection.

Furthermore, with the ends of the fins 211 contacting the rear panel of the cabinet 70, heat conduction paths are formed from the PDP 100 to the cabinet 70 through the fins 211. The heights of the fins 211 and outer edge portions 44 are respectively chosen so that the ends of the fins 211 extrude outwardly of the extruding ends of the outer edge portions 44.

Though not shown in the figure, venting holes are formed in the side faces, as well as the top and bottom faces, of the cabinet 70, and the air moves inside and outside the cabinet through the venting holes.

Further, as shown in FIG. 4, a finned external heat sinking unit 140 is mounted on the back surface of the cabinet 70 so that the heat from the PDP 100 can be transferred through the fins 211 and dissipated. The finned external heat sinking unit 140 is mounted increasing the heat dissipating area of the cabinet 70, so that their fins makes rows in the vertical direction of the cabinet 70.

Rather than mounting the finned external heat sinking unit 140, as described above, the rear panel of the cabinet 70 may be shaped in the form of a net or grating to increase the venting area. With this structure also, the PDP 100 can be cooled efficiently.

The display apparatus incorporating the PDP 100 of the first embodiment can therefore be constructed using a small number of fans sufficient to cause the movement of the air surrounding the heat sinking unit 2. Furthermore, if the PDP 100 is mounted in the display apparatus so that the heat sinking unit 2, especially the fins 211, is exposed efficiently to the ventilation air flow, the heat sinking capability of the PDP 100 of the first embodiment can be further enhanced, making it possible to eliminate the need for fans.

Depending on the curved condition of the panel unit used for the plasma display panel, there occur cases where the difference in the direction normal to the face between the periphery and the largest curved portion reaches about 4 mm in the case of a 40-inch diagonal display apparatus. There also occur cases where the panel unit is curved with its rear surface forming a convex. In such cases also, the plasma display panel of the present invention can address the heat sinking problem regardless of the size, curvature, and orientation of the panel unit, as effectively as the above-described embodiment.

Since the fin blocks 21 of the first embodiment are arranged in a checkerboard or matrix pattern on the panel unit back surface 11, the heat sinking unit 2 is deformed precisely following the curvature of the panel unit back surface 11 in horizontal and vertical directions. As a result, the PDP 100 of the first embodiment provides excellent heat conduction capability.

Figure 5:
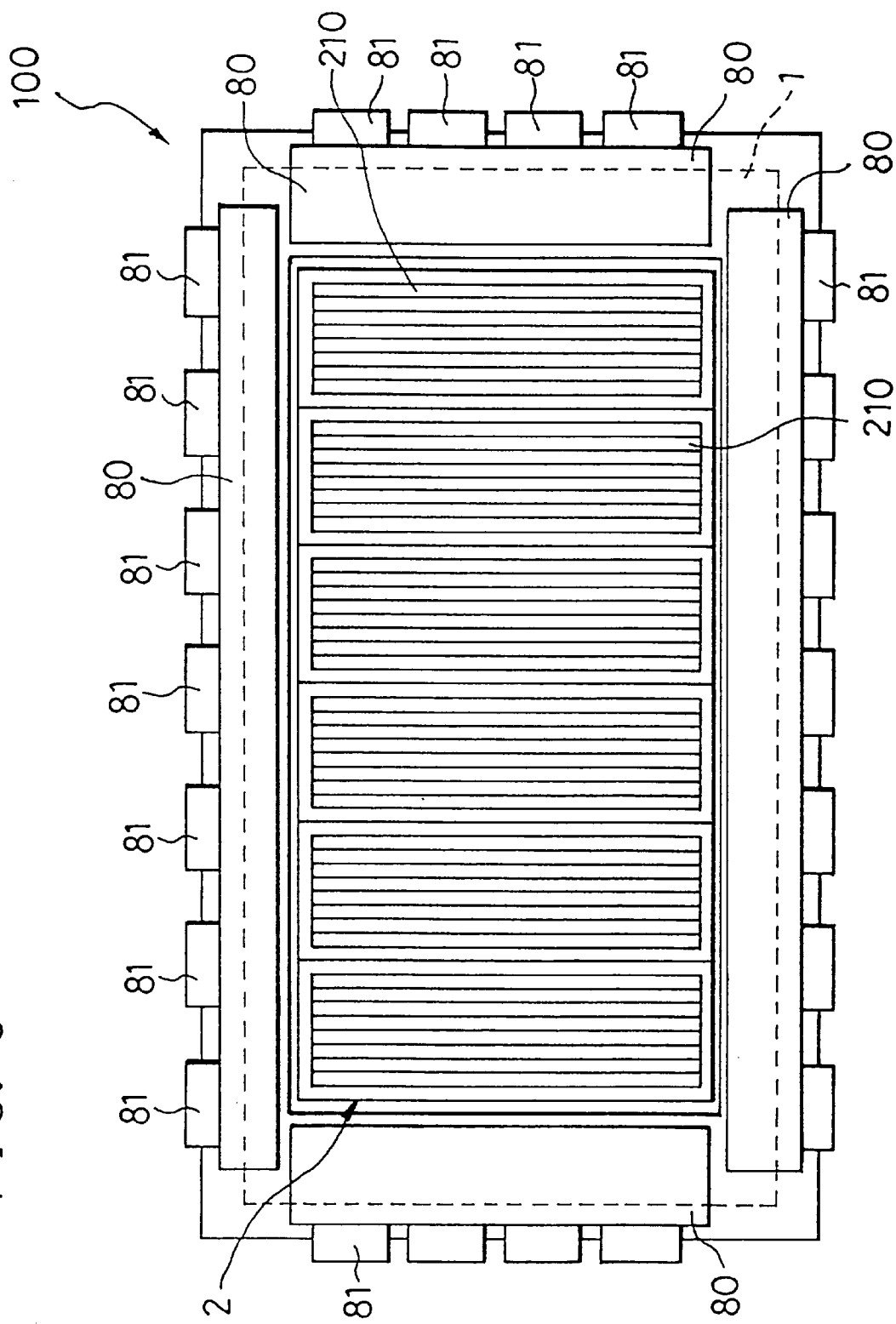
FIG. 5 is a rear view showing another embodiment of the plasma display panel of the present invention.

In the above-mentioned first embodiment, the plurality of fin blocks 21 are arranged in a checkerboard pattern over the entire back surface 11 of the panel unit 1; alternatively, each fin block may be formed in a rectangular shape about 100 mm in width and elongated in a vertical or horizontal direction, and such fin blocks may be arranged over the entire back surface 11 of the panel unit 1. An example of such arrangement is shown in FIG. 5. FIG. 5 is a rear view of the PDP provided with elongated fin blocks 210 extending in vertical direction. In FIG. 5, the parts identical in construction and function to those shown in FIG. 3 are designated by the same reference numerals, and their explanation will not be repeated here.

When the fin blocks 210 are arranged as elongated blocks extending in vertical direction (in the vertical direction of the plasma display panel 100) as shown in FIG. 5, the heat sinking unit 2 is easily deformable along the curvature in the horizontal direction of the panel unit back surface 11.

In either case, by arranging arrays of 10 to 20 fin blocks in vertical and/or horizontal directions, the gap between the panel unit back surface 11 and the heat sinking unit 2 can be reduced to 0 to 0.1 mm, a reduction by a factor of 10 or more compared with the few millimeters in the prior art structure. This eliminates thermal resistance between the panel unit back surface 11 and the heat sinking unit 2, thus providing a structure of excellent thermal conduction.

In the above-mentioned first embodiment, only the adhesive layer 50 is provided between the panel unit back surface 11 and the heat sinking unit 2. Instead, a synthetic resin layer or silicone grease may be provided for bonding between the panel unit back surface 11 and the heat sinking unit 2 to promote the heat conduction between them. Alternatively, the panel unit back surface 11 and the heat sinking unit 2 may be bonded together by interposing a heat equalizing layer between them, or may be contacted together directly.

If a layer having a cushion effect is interposed between the panel unit back surface 11 and the heat sinking unit 2, gaps between the hard-to-deform portions (fin blocks 21, etc.) of the heat sinking unit 2 and the panel unit 1 can be filled with such a layer. Moreover, if such a cushion layer is formed, the difference in expansion and contraction resulting from the difference in thermal expansion coefficient between the panel unit 1 and the heat sinking unit 2 can be absorbed.

The synthetic resin layer can be constructed, for example, from a silicone rubber sheet having excellent rubber elasticity and having a smaller thickness than the conventional one (the thickness, for example, not to exceed the gap (0.1 mm) between the panel unit back surface 11 and the heat sinking unit 2), or from a coated layer of silicone grease.

The heat equalizing layer can be constructed, for example, from a flexible metal film such as a flexible film of copper, or from a high-orientation graphite film having flexibility.

Figure 6:
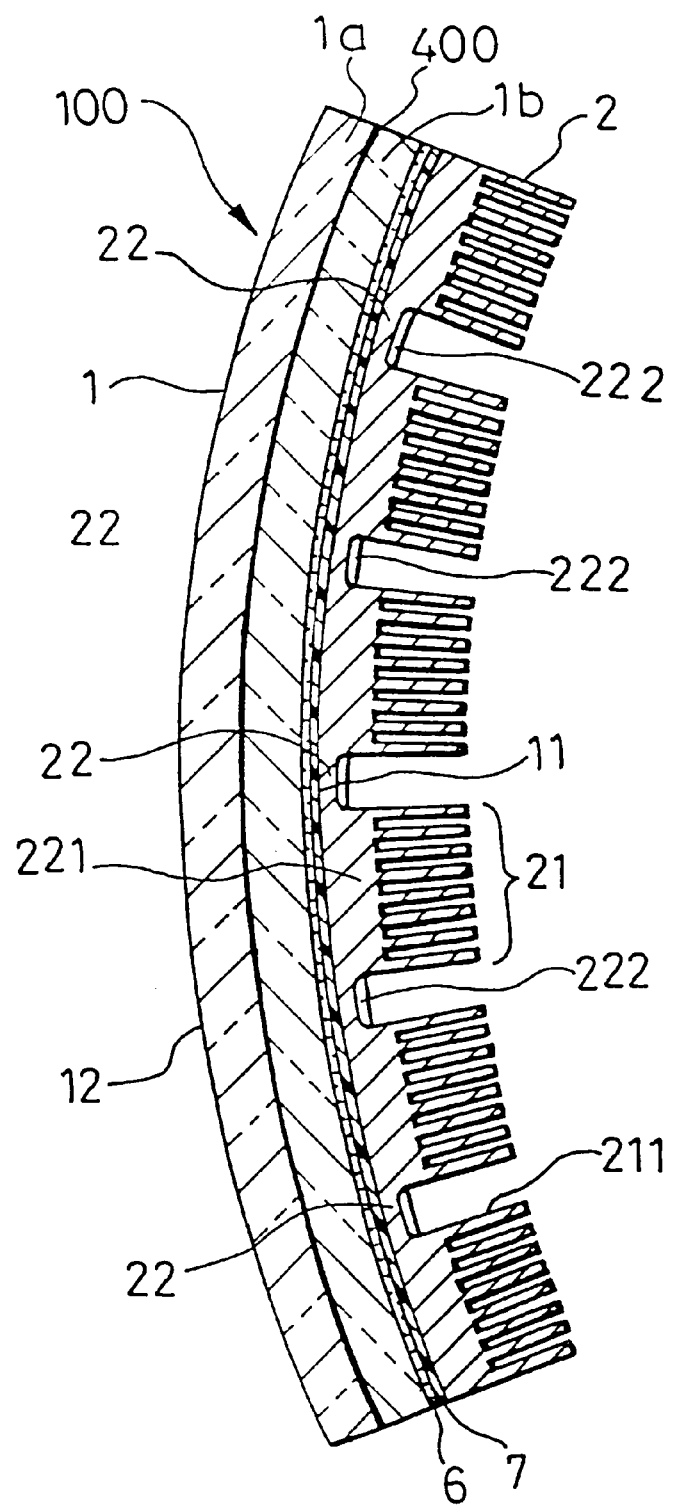
FIG. 6 is a rear view showing a further embodiment of the plasma display panel of the present invention.

Preferably, the high-orientation graphite film has graphite crystals so aligned as to provide higher thermal conductivity in the plane direction than in the thickness direction. Specific examples of high-orientation graphite are given in connection with a third embodiment to be described later. FIG. 6 is a cross-sectional view showing a structure when the PDP 100 of the first embodiment is provided with a graphite film 6 and a silicone rubber sheet 7.

Instead of interposing the adhesive layer 50 between the panel unit 1 and the heat sinking unit 2, the two units may be overlaid one on top of the other in directly contacting relationship, and joined together with adhesive applied only along the outer edges of the panel unit back surface 11.

Next, a method of fabrication for the PDP 100 of the first embodiment will be described with reference to the accompanying drawings.

Figure 7A:
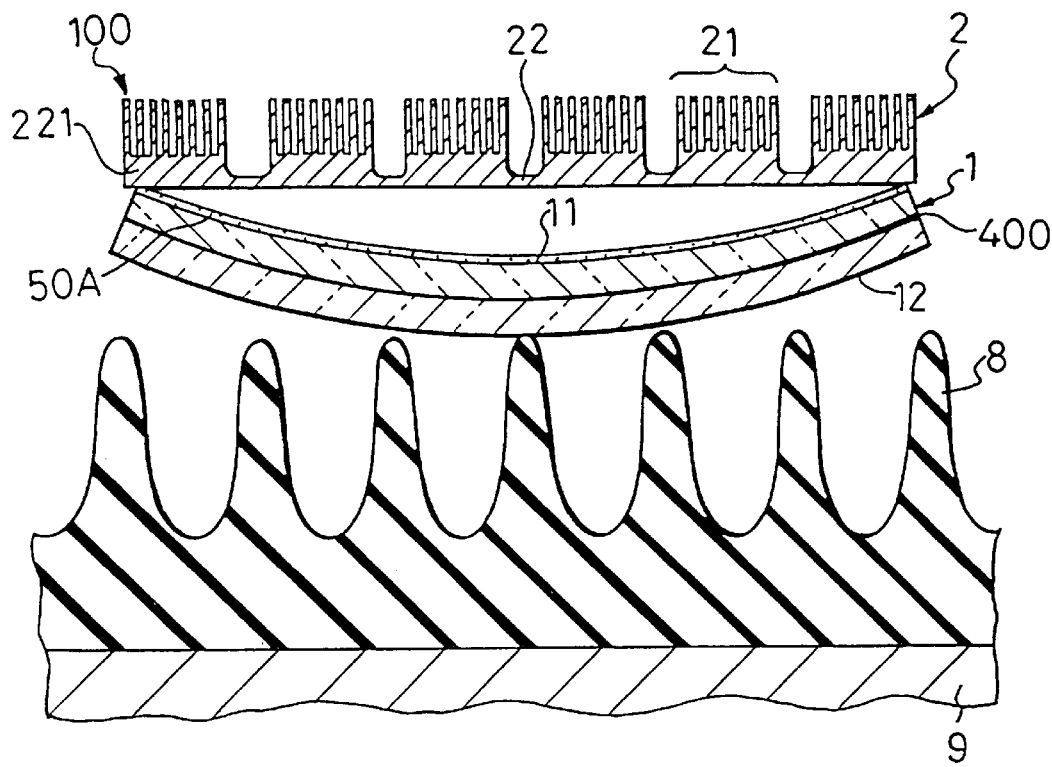
FIG. 7A is a schematic diagram showing one process step in a fabrication method for the plasma display panel of the first embodiment.
Figure 7B:
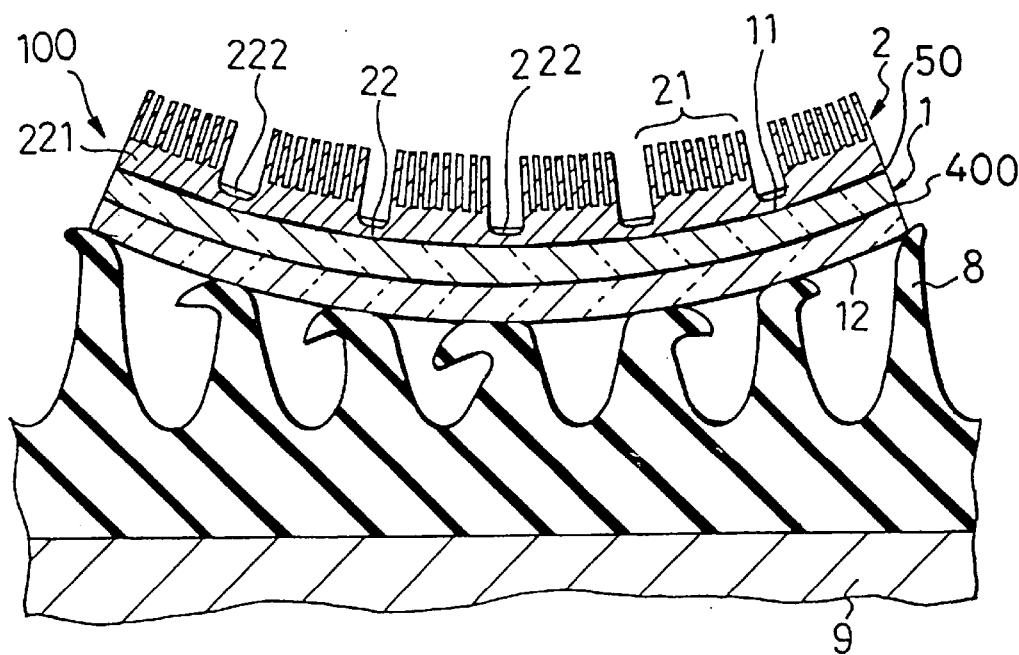
FIG. 7B is a schematic diagram showing one process step in the fabrication method for the plasma display panel of the first embodiment.

FIG. 7A is a schematic cross-sectional view showing a process step before the panel unit 1 and the heat sinking unit 2 are joined together in the fabrication method for the PDP 100 of the first embodiment, and FIG. 7B is a schematic cross-sectional view showing a process step where the panel unit 1 and the heat sinking unit 2 are joined together.

First, as shown in FIG. 7A, a surface 12 of the panel unit 1 is supported on a large number of flexible pins 8. The large number of flexible pins 8 are formed, each having a projected length greater than the amount of displacement, i.e. deflection, at the center of the curved panel unit 1 relative to the periphery thereof. Further, the overall area of the flexible pins 8 is made larger than the surface 12 of the panel unit 1 so that the flexible pins 8 can securely support the entire surface 12 of the panel unit 1.

The flexible pins 8 are formed from silicone rubber and fixed to a rigid base 9. The panel unit 1 supported on the flexible pins 8 is overlaid on the heat sinking unit 2 with the panel unit back surface 11 positioned in such a manner as to face the joining portion 221 of the heat sinking unit 2. The surface of the joining portion 221 facing the panel unit 1 is coated in advance with an adhesive 50A.

Next, the heat sinking unit 2 is pressed against the panel unit back surface 11, as shown in FIG. 7B. The pressing action in this bonding step is performed by applying a pressure sufficient to cause the heat sinking unit 2 to flex or bend at the thin-wall portions 22 between the fin blocks 21 in such a manner as to conform to the curvature of the panel unit back surface 11. At this time, the flexible pins 8 deform, thereby supporting the panel unit surface 12 over the entire region thereof. Since the entire region of the panel unit surface 12 is supported by the flexible pins 8 in this manner, the panel unit 1 in the bonding step is less likely to be subjected to a strain leading to breakage or damage.

Once the heat sinking unit 2 has been deformed in accordance with the curvature of the panel unit back surface 11, as described above, the deformed state is retained by the adhesive force of the adhesive layer 50. In an alternative construction, the deformed state is securely retained by double-sided adhesive tapes or clamping devices provided at the edges of the heat sinking unit.

After the above bonding step, a synthetic resin layer 222 is formed on top of each thin-wall portion 22. This reinforces the thin-wall portions 22 and improves the strength of the PDP 10. A thermosetting resin having excellent heat resistance is used as the synthetic resin to improve the strength of the PDP 10. It is preferable that the synthetic resin be hardened into a hardened polymerized resin after being deformed to a suitable shape.

When a synthetic resin layer and/or a heat equalizing layer or silicone grease are formed everywhere between the panel unit 1 and the heat sinking unit 2, the synthetic resin layer and the heat equalizing layer or silicone grease are deformed simultaneously with the heat sinking unit 2 by the pressing action in the bonding step in such a manner as to conform to the curvature of the panel unit back surface 11.

The PDP fabricated by the above-described fabrication process can be used for various types of display apparatus.

Embodiment 2

Next, a plasma display panel according to a second embodiment of the present invention will be described with accompanying drawing FIG. 8.

Figure 8:
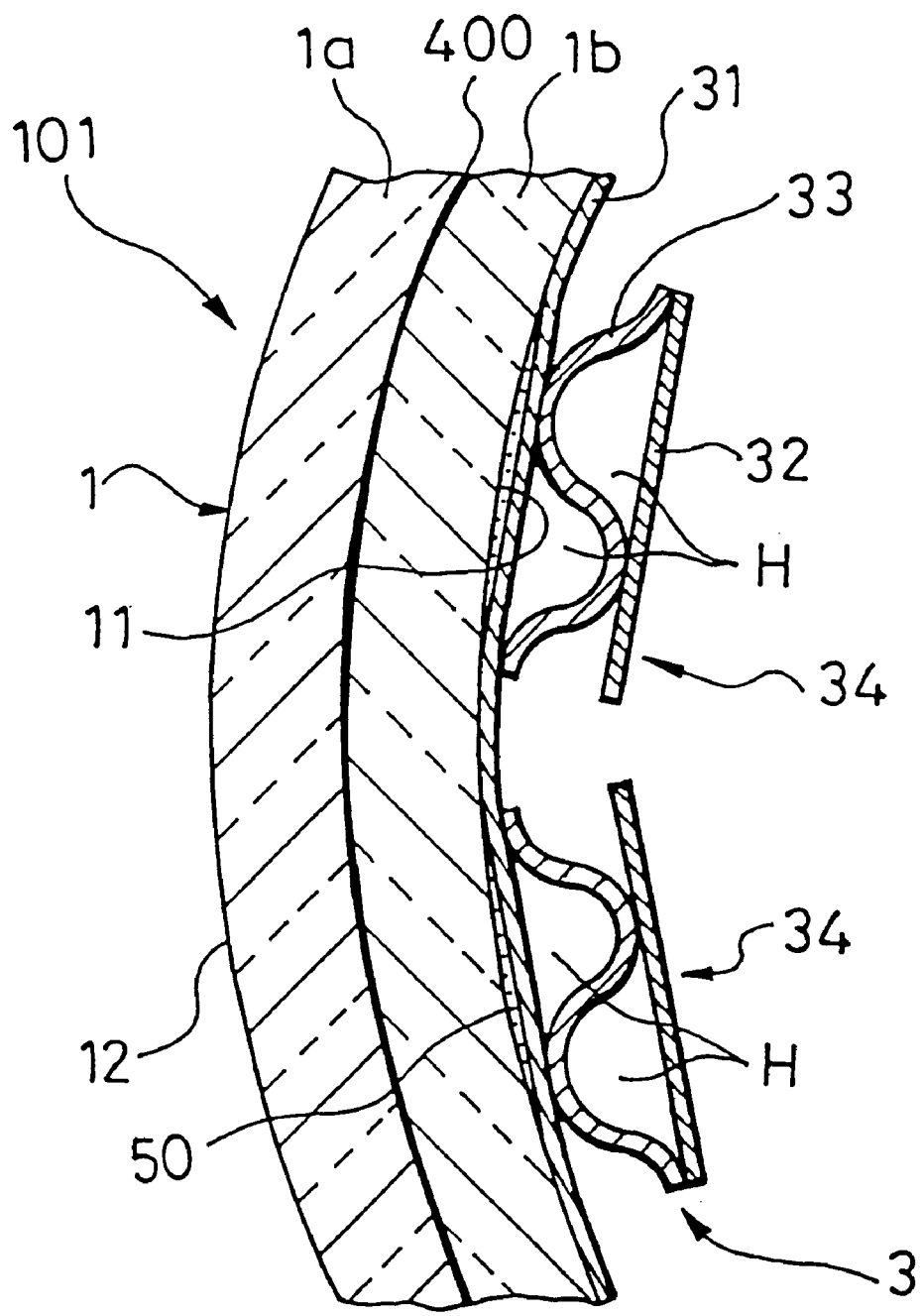
FIG. 8 is a cross-sectional view in enlarged form showing an essential portion of a plasma display panel according to a second embodiment of the present invention.

FIG. 8 is an enlarged cross-sectional view of the plasma display panel (hereinafter abbreviated as PDP) 101 according to the second embodiment. The basic construction of the PDP 101 of the second embodiment is the same as that of the foregoing first embodiment, the difference being in the construction of the heat sinking unit. The construction of the heat sinking unit 3 of the second embodiment will be described below.

The heat sinking unit 3 of the second embodiment comprises a flexible sheet curved along the curvature of the back surface 11 of the panel unit 1, and a large number of heat transfer portions 34. Each heat transfer portion 34 consists of a thin flat plate 32 and a corrugated thin plate 33. The heat transfer portions 34 are fixed to the back surface of the flexible sheet 31, and are arranged at equally spaced intervals. The flat plate 32 is arranged parallel or nearly parallel to the flexible sheet 31. The flexible sheet 31, the flat plate 32, and the corrugated plate 33 are each formed from an aluminum member, and are joined together by welding or gluing as shown in FIG. 8. Narrow, long heat transfer paths H are formed between the corrugated surface of the corrugated plate 33, the flexible sheet 31, and the flat plate 32. The corrugated plate 33 is attached so that the venting direction of the heat transfer paths H is parallel to the vertical direction of the PDP 101.

The flexible sheet 31 may be constructed, for example, from a high-orientation graphite film having flexibility (for example, graphite with specific gravity of 0.5 to 1.5).

The heat sinking unit 3 consisting of the flexible sheet 31, flat plates 32, and corrugated plates 33 is relatively simple in construction and is easy to work and fabricate. Furthermore, since the heat sinking unit 3 of the above construction has a large surface area as well as the heat transfer paths H capable of passing air in vertical directions, the PDP 101 of the second embodiment provides excellent heat conduction capability.

Instead of the heat sinking unit 3 shown in FIG. 8, a heat sinking unit having a honeycomb heat transfer structure can be used. The components of this type of heat sinking unit are formed from a metal such as aluminum and are joined together by welding or gluing. The heat sinking unit can also be constructed using high-orientation graphite rather than a metal. Since high-orientation graphite has high thermal conductivity, a heat sinking unit formed from high-orientation graphite contributes to further enhancing the heat conduction capability of the PDP. Specific examples of high-orientation graphite will be described in the third embodiment hereinafter explained.

Embodiment 3

Next, a plasma display panel according to the third embodiment of the present invention will be described with accompanying drawing FIG. 9.

Figure 9:
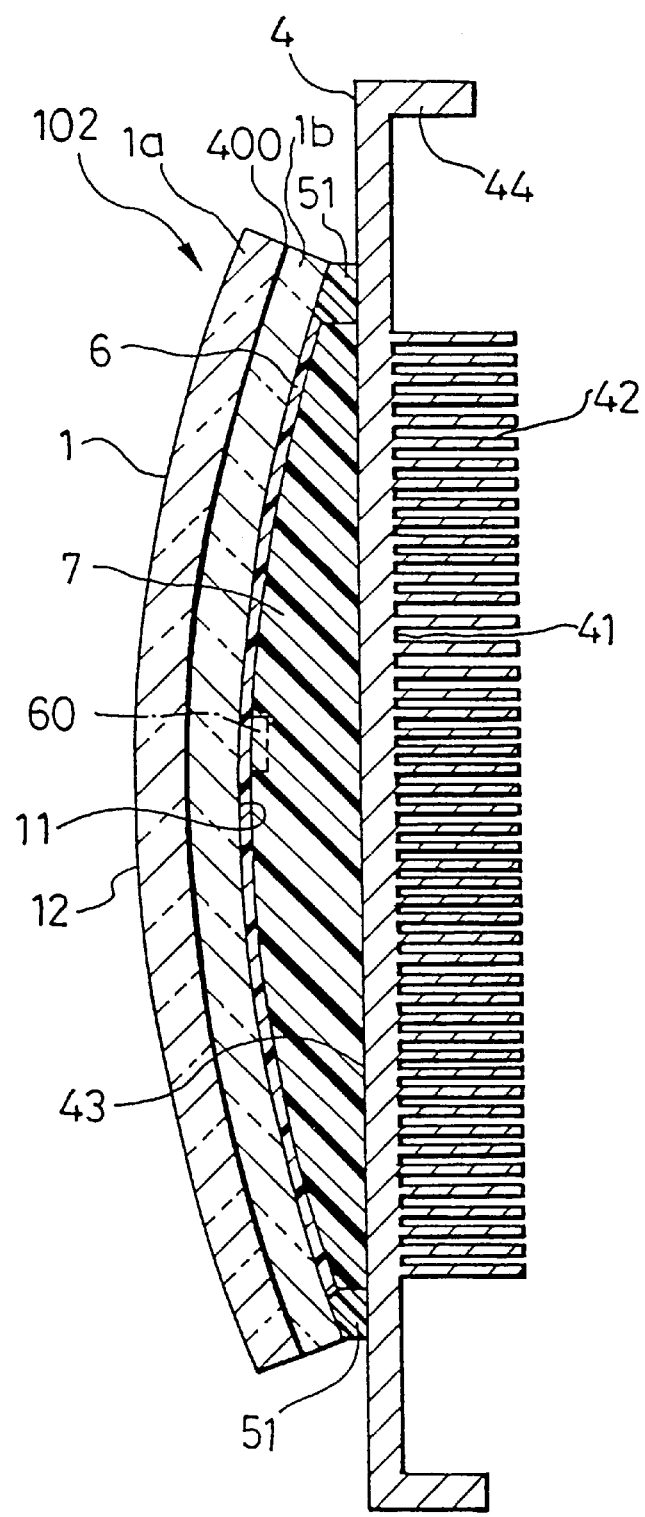
FIG. 9 is a schematic cross-sectional view showing a plasma display panel according to a third embodiment of the present invention.

FIG. 9 is a schematic cross-sectional view showing the plasma display panel (hereinafter abbreviated as PDP) 102 of the third embodiment. The basic construction of the PDP 102 of the third embodiment shown in FIG. 9 is substantially the same as that of the foregoing first and second embodiments, except that a high-orientation graphite film is interposed between the panel unit 1 and the heat sinking unit, and that the construction of the heat sinking unit is different.

The heat sinking unit 4 for the PDP 102 of the third embodiment comprises a plurality of fins 42 formed on an aluminum plate having substantially a recessed cross section, as shown in FIG. 9. The plurality of fins 42 are formed on the back surface 41 of the heat sinking unit 4. A front surface 43 of the heat sinking unit 4 is joined to the panel unit back surface 11. The outside faces of the outer edge portions 44 of the heat sinking unit 4 are joined to the cabinet of a display apparatus.

The heat sinking unit 4 of the third embodiment is a finned heat sink with fins integrally formed from aluminum; since the entire structure is hard and does not have flexibility, the heat sinking unit 4 does not deform along the curvature of the panel unit back surface 11. In the PDP 102 of the third embodiment, therefore, a heat equalizing layer having high heat conductivity is formed to fill the space between the panel unit back surface 11 and the heat sinking unit 4. More specifically, a high-orientation flexible graphite film 6 having a thickness of 0.2 mm is formed along the curvature of the panel unit back surface 11 to cover the entire region of the back surface 11 except the outer edge portions thereof (the portions that serve as bonding areas), and a silicone sheet 7 of 2 mm thickness is formed on top of the graphite film 6. The high-orientation graphite film 6 has high thermal conductivity and acts to even out local temperature differences.

The heat sinking unit 4 of the third embodiment is bonded to the panel unit 1 by an adhesive layer 51 formed along the outer edges of the panel unit back surface 11. The graphite film 6 has a specific gravity in the range of 0.5 to 1.5. The silicone sheet 7 is deformed conforming to the shape of the space between the panel unit back surface 11 and the heat sinking unit 4.

A one-component thermosetting silicone adhesive having excellent rubber elasticity (for example, FE-61 manufactured by Shin-Etsu Chemical Co., Ltd.) is used as the adhesive forming the adhesive layer 51.

Furthermore, if the high-orientation graphite film is also formed between the back surface of the silicone sheet 7 and the front surface 43 of the heat sinking unit 4, temperature variations among the fins 42 can be reduced throughout the PDP 104, which serves to further enhance the heat sinking effect.

The heat generated inside the panel unit 1 during the operation of the PDP 102 of the third embodiment is dissipated outside from the surfaces of the panel unit 1. In particular, much of the heat generated inside the panel unit 1 is conducted from the panel unit back surface 11 to the heat sinking unit 4 through the graphite film 6 and silicone sheet 7 or through the adhesive layer 51. The heat conducted to the heat sinking unit 4 is dissipated into the outside air from the surfaces of the heat sinking unit 4, especially the surfaces of the fins 42.

In the third embodiment, since the graphite film 6 is formed on the panel unit back surface 11, heat locally generated in the panel unit 1 is quickly transferred in lateral directions along the plane to raise the temperature of non-activated portions of the panel unit 1. Accordingly, in the panel unit 1 of the third embodiment, localized temperature rises are evened out and the overall temperature rise is suppressed. The heat conducted to the heat sinking unit 4 is dissipated into the air from the plurality of fins 42. The heat sinking unit 4 is formed from an aluminum material having a good heat sinking property, with the fins 42 increasing the substantial heat dissipating area. Thus the PDP 102 of the third embodiment has an excellent heat sinking structure.

In the third embodiment, a finned heat sink made of aluminum is used as the heat sinking unit, but instead of the finned heat sink, it is possible to use a heat sinking unit constructed from pairs of thin parallel flat plates joined together by sandwiching a thin corrugated plate between them. It is also possible to use a heat sinking unit having a honeycomb structure joined to a thin flat plate. The components of these heat sinking units are formed from a metal such as aluminum and are joined together by welding or gluing. The heat sinking unit can also be constructed using high-orientation graphite rather than a metal.

The silicone sheet 7 has good thermal conductivity, but instead of the silicone sheet, other synthetic resin sheets having good thermal conductivity, for example, a synthetic resin containing alumina, can be used.

The space formed between the heat sinking unit 4 and the panel unit back surface 11 can be filled with high-orientation graphite, or a composite structure containing high-orientation graphite, or a multilayered structure consisting of a high-orientation graphite film and a synthetic resin layer or silicone grease.

When using high-orientation graphite to fill the space, either the graphite is formed into a bulk body having the same shape as the shape of the space, or a plurality of high-orientation graphite films are stacked one on top of another.

In the third embodiment, a Peltier element 60 as a heat absorber is mounted on the back surface of the graphite film 6, as shown by a dashed line in FIG. 9. It is desirable that an electric circuit for flowing a current in a direction that absorbs heat be connected to the Peltier element 60 at the side bonded to the graphite film 6. In this case, the opposite side of the Peltier element 60 is thermally contacted with the heat sinking unit 4. During the operation of the PDP 102, when the Peltier element 60 is energized so as to absorb heat, the heat in the panel unit 1 is absorbed from the entire region of the panel unit back surface 11 into the Peltier element 60 through the graphite film 6. In this way, the PDP 102 of the third embodiment can actively cool the panel unit 1. In an alternative configuration, the graphite film 6 may be extended outwardly of the PDP 102 and the Peltier element 60 may be mounted on the extended portion. However, when the size of the PDP is large, it is preferable that the Peltier element 60 be mounted near the center of the back surface of the panel unit so that the heat from the panel unit 1 can be quickly transferred to the Peltier element 60, which enhances the effectiveness in suppressing the temperature rise of the panel unit 1.

In the case of a construction where a multilayered structure consisting of the high-orientation graphite film 6 and synthetic resin sheet is used to fill the space between the panel unit 1 and the heat sinking unit 4, the adhesive layer 50 used in the first embodiment may be formed thin (for example, to a thickness of about 0.1 mm) for bonding them together.

The high-orientation graphite used in the third embodiment should be high-crystalline graphite with graphite crystals oriented substantially in one direction, especially graphite whose rocking characteristic is 20 deg. or lower. Examples include a film formed by depositing layers of carbon atoms one on top of another by CVD using a hydrocarbon-based gas, and then annealing the resulting structure, and a film made by graphitizing a particular polymer compound. Among others, a film made by graphitizing a polymer compound is preferable because it provides good thermal conductivity.

When the rocking characteristic of the high-orientation graphite used in the third embodiment was measured at peak positions of graphite (0002) lines by X-ray analysis, the average of the measured values at 10 points was 12.8 degrees. Fabrication methods, etc. for forming the above-mentioned film made of particular polymer compound are disclosed in detail in U.S. Pat. No. 5,091,025, Japanese Patent Unexamined Publication No. Hei 3-75211, etc.

The above particular polymer compound may be selected from the group consisting of polyoxadiazoles (POD), polybenzothiazole (PBT), polybenzo-bis-thiazole (PBBT), polybenzooxazole (PBO), polybenzo-bis-oxazole (PBBO), polyimides (PI), polyamides (PA), polyphenylenebenzoimidazole (PBI), polyphenylene-benzo-bisimidazole (PPBI), polythiazole (PT), and polyparaphenylene-vinylene (PPV).

The polyoxadiazoles include polyparaphenylene-1,3,4-oxadiazole, and their isomers.

The polyimides include an aromatic polyimide generally represented by the following formula (1).

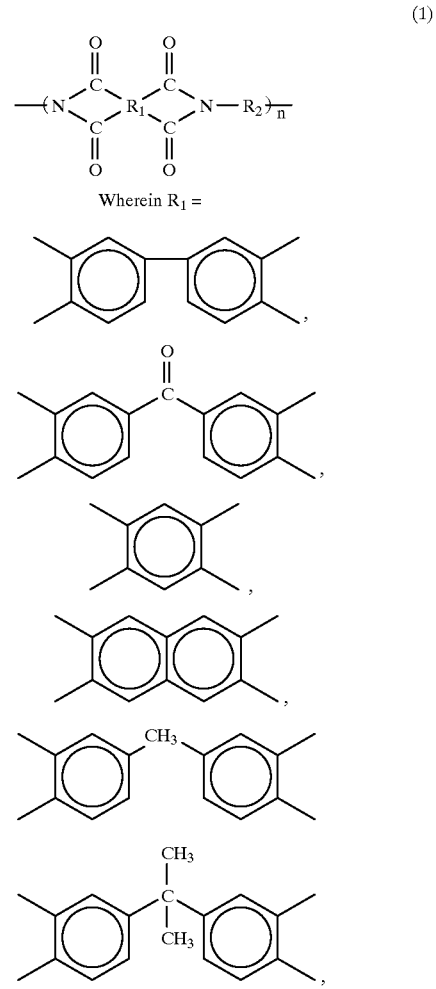

-continued

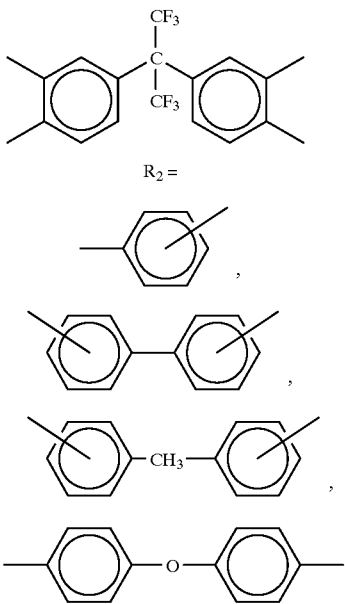

The polyamides include an aromatic polyamide generally represented by the following formula (2).

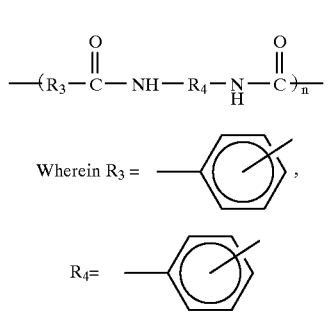

The polyimides and polyamides used here are not limited to those having the above structures.

The baking conditions for graphitizing the polymer compound film are not specifically limited, but it is preferable to bake it at temperatures above 2000° C., and preferably at temperatures around 3000° C., in which case graphite with excellent high orientation can be obtained. The baking is usually performed in an inert gas. During the baking, the process atmosphere is held in a pressurized condition; to minimize the effect of the gas generated during the process of graphitizing, the film thickness of the polymer compound is preferably 5 μm or greater. When baked at temperatures below 2000° C., the resulting graphite tends to become hard and brittle. After baking, the baked product may be rolled as necessary. In the graphitizing process, the film of the polymer compound is, for example, cut to a suitable size and heated to 3000° C. After baking, the baked product is further transferred to a rolling process as necessary.

The high-orientation graphite product thus produced may be in any of three forms, a plate, a sheet, or a film. Also, it may have flexibility or may be a hard product having no flexibility. For example, an inflexible high-orientation graphite product obtained by baking an aromatic polyimide has a specific gravity of 2.25 (compared with 2.67 of aluminum), thermal conductivity in AB plane direction of 860 kcal/m·h·° C. (2.5 times that of copper, 4.5 times that of aluminum), electrical conductivity in AB plane direction of 250,000 S/cm, and elasticity in AB plane direction of 84,300 kgf/mm$^2$.

A flexible high-orientation graphite product has a specific gravity (0.5 to 1.5) smaller than that of its inflexible counterpart, but retains about the same thermal conductivity, and is therefore preferred for use as the flexible sheet and/or the heat equalizing layer for the heat sinking unit of the present invention.

When using high-orientation graphite for the material of the flexible sheet and/or the heat equalizing layer for the heat sinking unit, it is preferable that the graphite crystals be oriented so that the high-orientation graphite film has higher thermal conductivity in its plane direction than in its width direction, by considering the requirement that localized temperature rises in the panel unit be prevented and local temperature variations be minimized.

When using a high-orientation graphite product of film form, the film thickness of the polymer compound used as the material is preferably within the range of 5 to 400 μm, and more preferably within the range of 5 to 200 μm when good flexibility is considered. If the film thickness of the material is greater than 400 μm, the film will break to pieces and reduce to powder because of the gas generated from within the film during the process of heat treatment; such a product is by itself unfit for use as a good material.

However, powdered graphite can be formed into a usable graphite sheet if it is prepared as a composite material, for example, with a fluororesin such as a polytetrafluoroethylene generally known as Teflon.

It is also possible to pulverize the high-orientation graphite product into scales and use it as a composite material with a polymer resin such as a fluororesin. In such composite materials, the ratio (weight ratio) between the graphite and polymer resin will be suitable if it lies within the range of 50:1 to 2:1 (graphite to polymer resin). When this composite material is extrusion-molded, carbon crystals orient in the direction perpendicular to the direction of extrusion, providing high thermal conductivity along that perpendicular direction.

When using high-orientation graphite for construction of the heat sinking unit 4 of the third embodiment, the heat sinking unit can be easily formed in a desired shape by using, for example, the above-described composite material.

When filling the space between the panel unit 1 and the heat sinking unit 4 with the high-orientation graphite, a structure consisting of a plurality of flexible high-orientation graphite films stacked atop one another is sandwiched between the panel unit 1 and the heat sinking unit 4.

Further, for the flexible sheet and the heat equalizing layer in the heat sinking unit 4, it is possible to use a sandwich structure (high-orientation graphite film/normal graphite sheet/high-orientation graphite film) consisting of a normal graphite sheet (or carbon sheet) sandwiched between a pair of high-orientation graphite films.

In the third embodiment, since the high-orientation graphite film 6 and/or the heat sinking unit 4 are thermally connected to the Peltier element 60, the panel unit 1 can be actively cooled by the cooling function of the Peltier element 60. The Peltier element 60 is arranged with its heat absorbing portion located within the space between the panel unit 1 and the heat sinking unit 4 and contacting over a surface with the high-orientation graphite film or the heat sinking unit. In this case, the heat releasing portion of the Peltier element 60 is contacted in a heat conductible manner with a member that dissipates heat outside, such as the heat sinking unit 4. The current applied to the Peltier element 60 is in the direction that absorbs heat.

The above-described PDP 102, with drive circuitry installed in it, is housed in the cabinet, to complete the construction of the display apparatus in accordance with the present invention.

For the material, shape, and structure of the cabinet of the display apparatus, the same construction as that of the cabinet of the display apparatus using the prior art PDP can be employed. For the material forming the cabinet, a metal having a good heat sinking property is preferred; for example, aluminum is a desirable material. It is desirable to construct the cabinet using the above-described high-orientation graphite since it has excellent thermal conductivity.

As for the shape of the cabinet, it is desirable that venting holes for effectively passing the air inside and outside the cabinet be formed everywhere in the top and bottom faces of the cabinet. A finned external heat sinking unit may be mounted, for example, on the back surface of the cabinet, to provide an irregular surface for increased heat dissipating area. When mounting the external heat sinking unit, it is preferable that the heat sinking unit mounted on the back surface of the panel unit be connected with the cabinet in a heat conductible manner. The external heat sinking unit can employ the same material and construction as those employed for the external heat sinking unit of the prior art PDP in the display apparatus.

Embodiment 4

Figure 10:
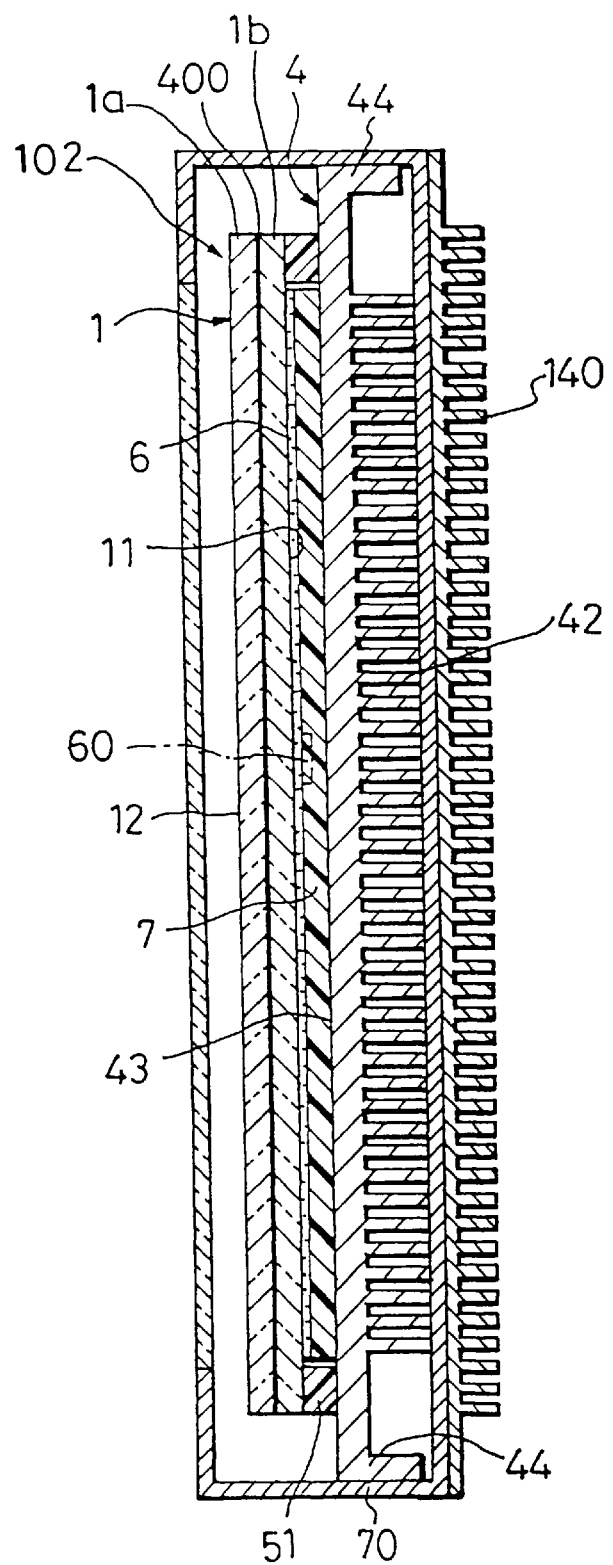
FIG. 10 is a schematic cross-sectional view showing a display apparatus according to a fourth embodiment of the present invention.

A display apparatus according to a fourth embodiment of the present invention will be described below with reference to drawing. FIG. 10 is a schematic cross-sectional view showing the display apparatus of the fourth embodiment.

The display apparatus of the fourth embodiment shown in FIG. 10 uses the PDP 102 of the foregoing third embodiment.

A cabinet 70 of the display apparatus is an aluminum box. The PDP 102 is mounted with its front surface facing outward through an opening in the front of the cabinet 70. The heat sinking unit 4 is mounted with the outside faces of its outer edge portions 44 contacting the inner faces of the side portions of the cabinet 70. The arrays of the fins 42 extend in the vertical direction of the PDP 102; this structure facilitates flow by natural convection.

Furthermore, with the ends of the fins 42 contacting the rear panel of the cabinet 70, heat conduction paths are formed from the PDP 102 to the cabinet 70 through the fins 42. The heights of the fins 42 and outer edge portions 44 are respectively chosen so that the ends of the fins 42 extrude outwardly of the extruding ends of the outer edge portions 44.

Though not shown in the figure, venting holes are formed in the side faces, as well as the top and bottom faces, of the cabinet 70, and the air moves inside and outside the cabinet through the venting holes.

As shown in FIG. 10, a finned external heat sinking unit 140 is mounted on the back surface of the cabinet 70 so that the heat from the PDP 102 can be conducted and dissipated through the fins 42. The finned external heat sinking unit 140 is mounted extending in the vertical direction of the cabinet 70, increasing the heat dissipating area of the cabinet 70.

Rather than mounting the finned external heat sinking unit 140, as described above, the rear panel of the cabinet 70 may be shaped in the form of a net to increase the venting area. With this structure also, the PDP 102 can be cooled efficiently.

The external heat sinking unit 140 in the above-described fourth embodiment uses an aluminum finned heat sink, but it is also possible to use a heat sink consisting of a pair of thin flat plates with a thin corrugated plate sandwiched between them (the so-called corrugated structure), or a heat sink constructed with a honeycomb structure. The heat sinking unit constructed with corrugated plates and flat plates is simple in construction and easy to work and fabricate, and has excellent heat sinking capability since it can provide enlarged surface area while securing good heat transfer paths.

Rather than mounting the external heat sinking unit 140 of the fourth embodiment, the rear panel of the cabinet 70 may be shaped in the form of a net to increase the venting area. With this structure also, the PDP 102 can be cooled efficiently.

The heat generated during the operation of the PDP 102 is conducted to the heat sinking unit 4 and dissipated into the air from the fins 42, is conducted from the fins 42 and outer edge portions 44 to the cabinet 70 and dissipated into the air from the surfaces of the cabinet 70, and is conducted from the cabinet 70 to the external heat sinking unit 140 and dissipated into the air from the surfaces thereof. In this way, in the display apparatus with the PDP 102 assembled in it, since the heat from the PDP 102 is efficiently dissipated outside through every possible path, it is only necessary to provide a number of fans just enough to cause the movement of air around the heat sinking unit 4, and the number of fans can thus be minimized.

If venting holes are formed in the cabinet 70 so that the outside air can be efficiently introduced to the heat sinking unit 4, especially the fins 42, that facilitates the movement of air between the area surrounding the heat sinking unit 4 and the outside of the cabinet 70, further promoting heat dissipation. This structure allows a further reduction in the number of fans, and it is even possible to eliminate the need for fans.

When the Peltier element 60 is mounted on the high-orientation graphite film 6, as in the construction of the third embodiment, the display apparatus can provide high heat sinking capability without having to install the external heat sinking unit 140 and/or fans.

The fourth embodiment has been described as using the PDP of the third embodiment, but the display apparatus can also be constructed by housing the PDP of the first or second embodiment in the cabinet 70.

In the present invention, the material and construction of the PDP differ depending on the type and required performance of the PDP. For example, the same material and construction as used for the panel unit of a known DC color PDP, an AC color plasma display panel, or other ordinary plasma display panel, can be employed.

The heat sinking unit joined to the back surface of the panel unit is mounted preferably in such a manner as to cover the entire back surface of the panel unit or substantially the entire region of the back surface of the panel unit excluding the edge portions thereof, or at the top and center portions of the back surface of the panel unit. With this arrangement, the heat sinking unit exhibits excellent heat sinking performance.

For the construction of the heat sinking unit, it is preferable to use a material that can conduct heat better than the material (for example, glass) of the panel unit, has a good heat sinking property, and is easy to work, or a metal that has good bonding capability with adhesive; for example, aluminum is a desirable material. For the material of the joining portion; high-orientation graphite is preferred because of its excellent heat conductivity, but it is also possible to use a normal graphite sheet or carbon sheet when the amount of heat generation is moderate.

The heat sinking unit of the present invention consists of heat dissipating portions and a joining section. The heat dissipating portions includes portions that have the function of dissipating heat by providing enlarged area contacting the air. The heat dissipating portions are arranged spaced apart from each other on the joining section, for example, horizontally and vertically in a checkerboard pattern, vertically in a plurality of arrays, or horizontally in a plurality of arrays. Preferably, each heat dissipating portion has a shape capable of efficiently dissipating panel heat into the surrounding air, and is formed in such an irregular shape as to increase the heat dissipating area and facilitate the flow of air contacting it. The heat dissipating portion is constructed, for example, from thin plates or the like having a cross section of protruding shape, inverted V shape, or corrugated shape, or a thin flat plate placed over such thin plates, or from a honeycomb structure or a structure having pin-like protrusions. Besides these, irregular structures of various shapes may be provided to increase heat dissipation. Heat sinking shapes and structures as used for various machines or other apparatus can be applied for the construction of these irregular structures.

The joining section according to the present invention has a flexible structure between heat dissipating portions. This flexible structure allows the joining section to conform to the curvature of the back surface of the panel unit. Since the joining section can thus be formed conforming to the curvature of the back surface of the panel unit, the gap between the panel unit and the heat sinking unit is reduced compared with the prior art structure, thus reducing the thermal resistance between the panel unit and the heat sinking unit and improving heat conduction. The joining section joins a large number of heat dissipating portions in a heat conductible manner. As a result, all the heat dissipating portions can be handled as a single unit, and heat transferred locally to the joining section is spread in directions parallel to the plane and transferred to many heat dissipating portions.

Preferably, the joining section according to the present invention is curved or bent between heat dissipating portions in such a manner as to follow the curvature of the back surface of the panel unit. The anchoring portions of the joining section to which the heat dissipating portions are rigidly joined do not have flexibility; therefore, the face of each anchoring portion joined to the back surface of the panel unit may be formed in advance in a convex or concave shape to conform to the curved shape of the back surface of the panel unit.

The heat sinking unit according to the present invention can be constructed using a structure comprising fin blocks each having at least one fin and a thin-wall portion connecting the fin blocks in a heat conductible manner and having a thickness thinner than the fin anchoring portion. In this structure, one fin block corresponds to one heat dissipating portion, and the fin anchoring portions and thin-wall portions together constitute the joining section. Each thin-wall portion has a flexible structure. The fins provide a sufficient heat dissipating area and is effective in causing a smooth air stream. Arranging such fins in multiple arrays along the vertical direction of the panel unit in its usual operating position ensures efficient air stream and heat transfer. In a configuration in which forced air is supplied to the heat sinking unit, the fins may be arranged along the flowing direction of the air.

The fin blocks are formed integral with the thin-wall portion from the material of the heat sinking unit by a cutting process, mold extrusion process, casting process, or other forming process. Alternatively, the heat sinking unit may be fabricated by first making a large number of fin blocks separately from a flexible sheet with the same thickness as the flexible thin-wall portion and a shape capable of being bonded to the back surface of the panel unit, and then arranging the fin blocks spaced apart at prescribed intervals on the flexible sheet and joining them together by gluing, welding, or other suitable means.

The joining section of the heat sinking unit according to the present invention can be constructed using a flexible sheet. In this case, the heat dissipating portions are fixed to the upper surface of the flexible sheet, and thus the flexible sheet is capable of being bent at portions between the anchoring portions of the heat dissipating portions. The flexible sheet is, for example, in the form of a sheet, a film, or a thin plate. The flexible sheet may be formed to have a flexible structure only between the anchoring portions of the heat dissipating portions, or may be formed to have a flexible structure throughout the sheet, including portions thereof to be bonded to the anchoring portions of the heat dissipating portions.

The above flexible sheet may be formed integral with the heat dissipating portions from the material of the heat sinking unit by a cutting process, mold extrusion process, casting process, or other forming process. Alternatively, the flexible sheet and the parts of the heat dissipating portions may be formed separately, from the material of the heat sinking unit, and then joined together by gluing, welding, or other suitable method.

Also, the portion of the joining section that connects the heat dissipating portions in a heat conductible manner may be constructed from a heat conductible coupling (or joint). This coupling constitutes the flexible portion of the joining section. It is, however, preferable to use the thin-wall portion or part of the flexible sheet as the flexible portion of the joining section, as described above, since the construction is simple and easy to manufacture.

The panel unit and the heat sinking unit according to the present invention may be joined together with a heat equalizing layer interposed between them. The heat equalizing layer is formed from a material having higher thermal conductivity than the base material (for example, glass) of the panel unit and capable of deforming following the curvature of the back surface of the panel unit; examples include a film, a sheet, or a thin plate formed from a metal, high-orientation graphite, or other flexible material having good heat conductivity. As a metal, for example, copper is a desirable material. For the material of the heat equalizing layer, high-orientation graphite having higher heat conductivity than the material of the heat sinking unit is preferred because of its excellent heat conductivity.

The panel unit and the heat sinking unit according to the present invention are joined together by adhesive or silicone grease, or only the edge portions of the back surface of the panel unit are bonded to the joining section of the heat sinking unit by adhesive or double-sided tape, or the panel unit and the heat sinking unit are joined together using clamping devices which clamp them from outside.

The adhesive used is the kind of adhesive that has rubber elasticity and that is capable of bonding together the materials forming the heat sinking unit and the panel unit. The rubber elasticity of the adhesive absorbs the difference in thermal expansion coefficient between the heat sinking unit and the panel unit, and ensures the bonding of the two members in good heat conducting condition. The adhesive having rubber elasticity includes, for example, a silicone-based adhesive. Among others, a silicone-based adhesive of thermosetting type is easy to use and provides good adhesion.

When the heat sinking unit is mounted following the curvature of the back surface of the panel unit, the underside of the heat sinking unit may not come into intimate contact with the back surface of the panel unit, and a gap may be caused. Even if the gap is filled with a synthetic resin, silicone grease, or the like, similarly to the prior art structure, their thickness can be made very thin compared with the prior art structure. As a result, the heat conduction from the panel unit to the heat sinking unit is greatly improved compared with the prior art structure.

The flexible portion of the joining section which connects between the heat dissipating portions has reduced strength, but this flexible portion is reinforced by a synthetic resin after being deformed along the curvature of the back surface of the panel unit. This reinforcement prevents the overall strength of the PDP from dropping.

Figure 11:
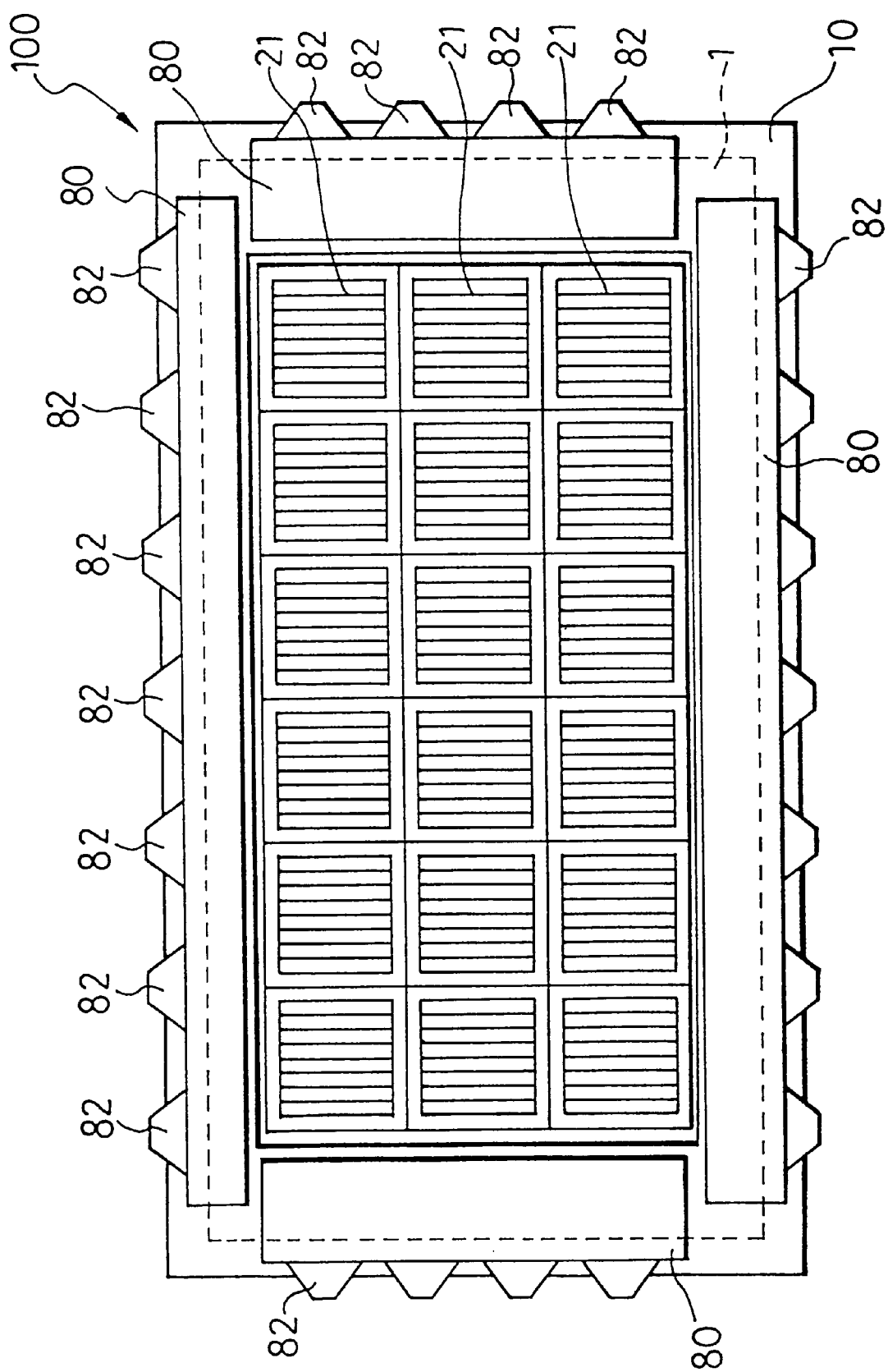
FIG. 11 is a rear view showing a display apparatus according to another embodiment of the present invention.
Figure 12:
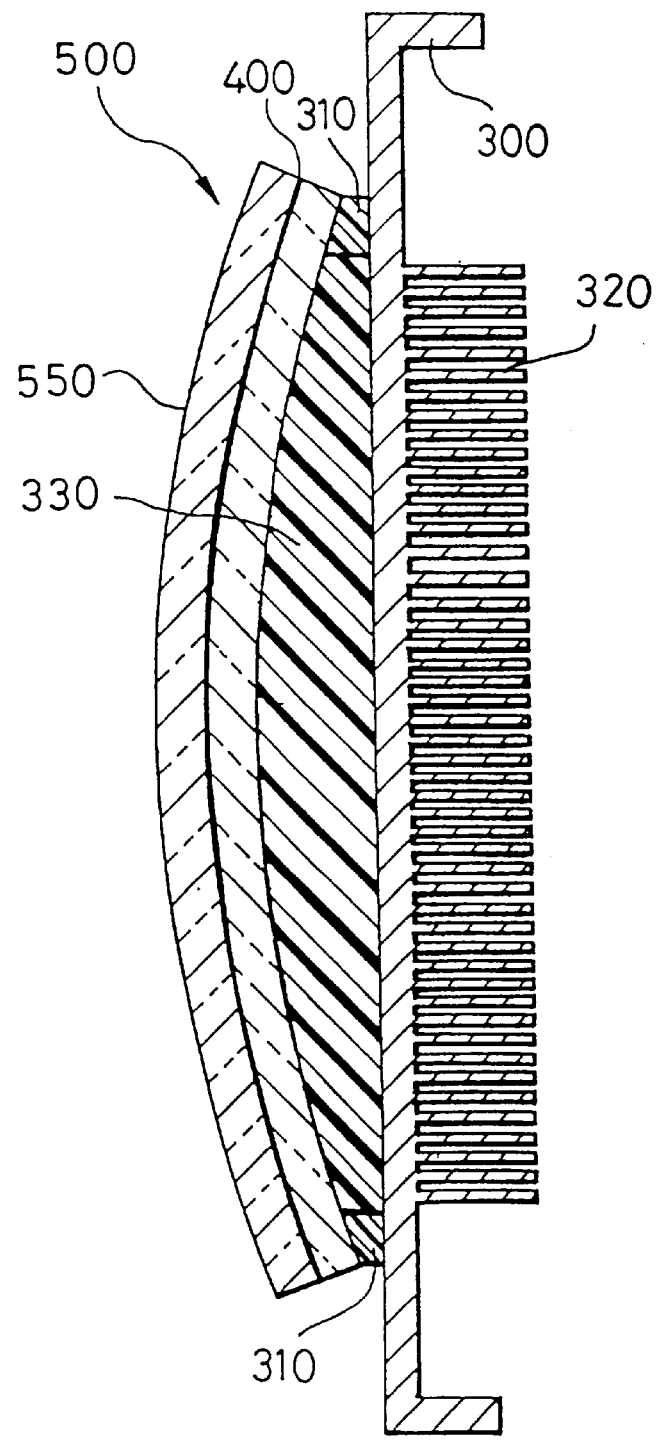
FIG. 12 is the schematic cross-sectional view showing the conventional plasma display panel.

The panel unit is electrically connected by flexible circuit boards to an electrical circuit for driving the PDP. The electrical driving circuit is folded over onto the back surface of the panel at portions where it is connected to the flexible circuit boards. The flexible circuit boards as connecting means are therefore arranged in such a manner as to surround the periphery of the heat sinking unit. In this construction, to ensure smooth flow of the air contacting the heat sinking unit, the flexible circuit boards are partially extended in the form of a plurality of tape-like circuit boards from the four sides of the panel unit, and these tape-like flexible circuit boards are arranged spaced apart from each other, thereby ensuring easy movement of the air. In this case, the plurality of tape-like flexible circuit boards are crossed in a raised manner, to increase the area not covered with the tapes and thereby facilitate smooth flow of the air. FIG. 11 shows a rear view of a PDP using the thus structured flexible circuit boards 82. The PDP shown in FIG. 11 is the PDP of the first embodiment, with the flexible circuit boards 82 as connecting means attached to it. Since the plurality of flexible circuit boards 82 are formed as thin strips, as shown in FIG. 11, the structure facilitates smooth flow of the air passing through the fins.

The front surface of the panel unit of the present invention is curved for the same reason as given for the curving of the back surface. Accordingly, during the manufacture of the PDP, if the panel unit is supported on a hard flat surface, a very strong force is applied to a limited portion of the panel unit, and the panel unit can easily be broken or damaged.

To prevent the breakage or damage of the panel unit, it is recommended that the following method be employed.

First, the curved panel unit containing a large number of discharge cells arranged horizontally and vertically in a matrix array is supported by a large number of flexible pins from the front surface side. The large number of flexible pins each have a length greater than the width of the largest curved portion and are formed over an area equal to or larger than the area corresponding to the front surface of the panel unit. It is desirable that the material and shape of the flexible pins be such that, when the heat sinking unit is pressed against the panel unit, the flexible pins are flexed and deformed to support the entire front surface of the panel unit. For example, a rubber structure is used that has on its top surface a large number of cones with their vertices pointing upward. The heat sinking unit is overlaid on the back surface of the panel unit supported on the flexible pins. The heat sinking unit is placed with its joining section facing the back surface of the panel unit. Then, the heat sinking unit is pressed against the back surface of the panel unit. The pressing action is performed by applying a pressure sufficient to cause the flexible portion to deform or bend following the curvature of the back surface of the panel unit. At this time, since the entire front surface of the panel unit is supported by the flexible pins, the panel unit is less likely to be subjected to a strain leading to breakage or damage. When interposing a heat equalizing layer between the panel unit and the heat sinking unit, the flexible sheet can be overlaid in an appropriate position, for example, directly on the back surface of the panel unit, on the gap-filling synthetic resin or silicone grease, on the adhesive, or directly below the heat sinking unit.

The flexible sheet is deformed following the curvature of the back surface of the panel unit by the pressing action. Instead of using the flexible pins, a concave structure consisting of a large number of varying-length pins made of hard material may be used to support the panel unit. In this case, the concave is designed by predicting the curvature and the direction of curving of the back surface of the panel unit.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

We claim:

1. A plasma display panel comprising:
   a panel unit of a curved panel-like shape containing a large number of discharge cells; and
   a heat sinking unit bonded along a curved back surface of said panel unit,
   wherein said heat sinking unit includes
      a large number of heat dissipating portions arranged spaced apart from each other by a prescribed distance, and
      a flexible joining section for connecting said panel unit with said heat dissipating portions in a heat conductible manner.

2. A plasma display panel according to claim 1, wherein said heat sinking unit includes
   fin blocks each having at least one fin and having a fin anchoring portion for holding said fin thereon, and
   a flexible thin-wall portion, having a thickness thinner than said fin anchoring portion, for connecting together said fin blocks in a heat conductible manner.

3. A plasma display panel according to claim 1, wherein said flexible joining section is a flexible sheet, said heat dissipating portions are fixed to said flexible sheet, and said flexible joining section is bonded along the curved back surface of said panel unit.

4. A plasma display panel according to claim 1, wherein a reinforcing synthetic resin layer is formed on said flexible joining section.

5. A plasma display panel according to claim 1, wherein a high-orientation flexible graphite film is interposed between said panel unit and said heat sinking unit.

* * * * *